US012652847B2

(12) United States Patent
Liu et al.

(10) Patent No.: US 12,652,847 B2
(45) Date of Patent: Jun. 9, 2026

(54) FLASH MEMORY AND METHOD OF FORMING THE SAME

(71) Applicant: Winbond Electronics Corp., Taichung City (TW)

(72) Inventors: Chi-Ching Liu, Taichung City (TW); Chia-Ming Liu, Taichung City (TW); Yao-Ting Tsai, Kaohsiung City (TW); Chang-Tsung Pai, Kaohsiung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 384 days.

(21) Appl. No.: 18/346,507

(22) Filed: Jul. 3, 2023

(65) Prior Publication Data

US 2024/0304681 A1     Sep. 12, 2024

(30) Foreign Application Priority Data

Mar. 10, 2023    (TW) .................................. 112108904

(51) Int. Cl.
H10D 64/01        (2025.01)
H10B 41/30        (2023.01)
(Continued)

(52) U.S. Cl.
CPC .......... H10D 64/035 (2025.01); H10B 41/30 (2023.02); H10D 30/6894 (2025.01); H10W 10/014 (2026.01); H10W 10/17 (2026.01)

(58) Field of Classification Search
CPC ............. H10D 64/035; H10D 30/6894; H10D 30/0411; H10D 30/68–689; H01L 21/76224; H10B 41/00–70; G11C 16/0408–0458; G11C 16/0483; G11C 11/5621–5642; G11C 2216/06–10; H10W 10/014; H10W 10/17

See application file for complete search history.

(56) References Cited

U.S. PATENT DOCUMENTS 5,453,385 A * 9/1995 Shinji ..................... H10P 36/03
                                                                    257/E21.318
5,874,317 A * 2/1999 Stolmeijer ........ H10W 10/0145
                                                                    257/E21.549
(Continued)

FOREIGN PATENT DOCUMENTS

TW        200735227 A      9/2007
TW        202234666 A      9/2022

*Primary Examiner* — Maliheh Malek
(74) *Attorney, Agent, or Firm* — MUNCY, GEISSLER, OLDS & LOWE, P.C.

(57)        ABSTRACT

The method of forming the semiconductor device includes the following steps. An isolation structure is formed between a plurality of active areas. Semiconductor structures are formed over the active areas, and a portion of each semiconductor structure is embedded in the isolation structure. Sacrificial structures are formed on the semiconductor structures. An ion implantation process is performed to form implanted regions between the portions of the semiconductor structures embedded in the isolation structure. The sacrificial structures are removed to form patterned semiconductor structures. A dielectric structure is formed on the patterned semiconductor structure. A control structure is formed on the dielectric structure.

7 Claims, 4 Drawing Sheets

<u>100</u>

(51) Int. Cl.
H10D 30/68 (2025.01)
H10W 10/00 (2026.01)
H10W 10/17 (2026.01)

(56) References Cited

U.S. PATENT DOCUMENTS

| | | | | |
|---|---|---|---|---|
| 6,001,706 A * | 12/1999 | Tan | H10W 10/0145 257/E21.549 |
| 6,140,182 A * | 10/2000 | Chen | H10B 69/00 438/296 |
| 6,159,801 A * | 12/2000 | Hsieh | H10D 30/6891 438/257 |
| 6,174,771 B1 * | 1/2001 | Leu | H10B 69/00 438/257 |
| 6,200,856 B1 * | 3/2001 | Chen | H10B 41/30 438/257 |
| 6,380,583 B1 * | 4/2002 | Hsieh | H10B 41/30 257/317 |
| 6,403,421 B1 * | 6/2002 | Ikeda | H10B 69/00 438/304 |
| 6,417,073 B2 * | 7/2002 | Watanabe | H10W 10/0143 257/E21.244 |
| 6,429,081 B1 * | 8/2002 | Doong | H10B 69/00 438/257 |
| 6,448,606 B1 * | 9/2002 | Yu | H10B 41/30 438/296 |
| 6,562,681 B2 * | 5/2003 | Tuan | H10B 41/30 438/257 |
| 6,642,104 B2 * | 11/2003 | Chang | H10B 69/00 438/257 |
| 6,649,472 B1 * | 11/2003 | Hsieh | H10B 69/00 438/257 |
| 6,720,610 B2 * | 4/2004 | Iguchi | H10B 41/30 257/315 |
| 6,743,675 B2 * | 6/2004 | Ding | H10B 41/30 438/257 |
| 6,768,161 B2 * | 7/2004 | Kinoshita | H10B 41/30 257/E27.103 |
| 6,794,708 B2 * | 9/2004 | Mori | H10D 84/014 257/314 |
| 6,838,342 B1 * | 1/2005 | Ding | H10D 30/6892 438/257 |
| 6,906,378 B2 * | 6/2005 | Sumino | H10B 69/00 257/374 |
| 6,969,884 B2 * | 11/2005 | Kitamura | H10B 69/00 257/314 |
| 6,984,563 B1 * | 1/2006 | Higgins, Sr. | H10B 69/00 438/257 |
| 7,049,236 B2 * | 5/2006 | Kim | H10D 64/035 438/211 |
| 7,091,091 B2 * | 8/2006 | Ding | H10B 69/00 438/657 |
| 7,196,370 B2 * | 3/2007 | Kai | H10B 69/00 438/257 |
| 7,211,485 B2 * | 5/2007 | Hyun | H10B 69/00 438/257 |
| 7,235,445 B2 * | 6/2007 | Ha | H10D 64/027 257/E21.429 |
| 7,297,595 B2 * | 11/2007 | Jung | H10B 69/00 438/596 |
| 7,300,843 B2 * | 11/2007 | Lee | H10B 69/00 438/596 |
| 7,368,346 B2 * | 5/2008 | Seo | H10B 41/30 438/257 |
| 7,468,535 B2 * | 12/2008 | Bez | H10W 10/0145 257/E21.549 |
| 7,504,304 B2 * | 3/2009 | Yaegashi | H10B 69/00 257/E21.546 |
| 7,598,536 B2 * | 10/2009 | Choi | H10B 41/40 257/E21.507 |
| 7,749,839 B2 * | 7/2010 | Hatakeyama | H10D 64/035 257/E21.422 |
| 7,829,931 B2 * | 11/2010 | Park | H10B 69/00 257/315 |
| 7,952,134 B2 * | 5/2011 | Byun | H10B 69/00 438/257 |
| 8,476,706 B1 * | 7/2013 | Chidambarrao | H10D 84/038 257/338 |
| 8,551,858 B2 * | 10/2013 | Fang | H10D 30/69 257/E21.546 |
| 9,391,177 B1 * | 7/2016 | Ma | H10D 30/0411 |
| 9,406,687 B1 * | 8/2016 | Yang | H10D 30/6892 |
| 9,583,591 B2 * | 2/2017 | Chuang | H10D 64/017 |
| 10,453,932 B2 * | 10/2019 | Liu | H10D 30/0411 |
| 11,211,469 B2 * | 12/2021 | Chen | H10B 41/41 |
| 11,404,328 B2 * | 8/2022 | Xu | H10D 64/01314 |
| 2002/0008278 A1 * | 1/2002 | Mori | H10D 84/0151 257/315 |
| 2002/0127798 A1 * | 9/2002 | Prall | H10D 30/683 438/257 |
| 2002/0173107 A1 * | 11/2002 | Doong | H10B 69/00 438/301 |
| 2003/0160265 A1 * | 8/2003 | Inoue | H10D 64/685 257/E29.089 |
| 2004/0061165 A1 * | 4/2004 | Ding | H10B 41/30 438/257 |
| 2004/0145007 A1 * | 7/2004 | Sumino | H10B 41/40 257/315 |
| 2006/0019446 A1 * | 1/2006 | Yang | H10B 41/49 438/257 |
| 2006/0157773 A1 * | 7/2006 | Yu | H10B 41/30 257/314 |
| 2007/0045752 A1 * | 3/2007 | Forbes | H10D 64/691 257/E21.205 |
| 2008/0203477 A1 * | 8/2008 | Yamazaki | H10D 30/0411 257/E29.302 |
| 2009/0261421 A1 * | 10/2009 | Gogoi | H10D 84/141 438/234 |
| 2010/0112799 A1 * | 5/2010 | Jeong | H10D 64/018 257/E21.21 |
| 2012/0007162 A1 * | 1/2012 | Lee | H10B 41/30 257/E21.546 |
| 2015/0228739 A1 * | 8/2015 | Tang | H10D 30/6892 438/266 |
| 2016/0218041 A1 * | 7/2016 | Du | H10D 84/0151 |
| 2017/0207090 A1 * | 7/2017 | Peng | H10D 62/021 |
| 2017/0278949 A1 * | 9/2017 | Peng | H10D 62/021 |
| 2018/0145131 A1 * | 5/2018 | Wang | H10D 62/115 |
| 2018/0151581 A1 * | 5/2018 | Wu | H10B 41/47 |
| 2018/0151707 A1 * | 5/2018 | Wu | H10D 30/0411 |
| 2021/0175071 A1 * | 6/2021 | Yang | H10P 76/2041 |
| 2021/0226114 A1 * | 7/2021 | Holmes | H10N 60/0912 |
| 2021/0320104 A1 * | 10/2021 | Huang | H10D 84/038 |
| 2022/0093619 A1 * | 3/2022 | Tsai | H10B 41/30 |
| 2023/0253204 A1 * | 8/2023 | Yang | H10P 76/2041 257/510 |

* cited by examiner

FLASH MEMORY AND METHOD OF FORMING THE SAME

CROSS REFERENCE TO RELATED APPLICATIONS

This Application claims priority of Taiwan Patent Application No. 112108904, filed on Mar. 10, 2023, the entirety of which is incorporated by reference herein.

BACKGROUND OF THE INVENTION

Field of the Invention

The embodiments of the present disclosure relate to a semiconductor device and a method of forming the same, and in particular they relate to a method of forming a semiconductor device including an ion implantation process and a semiconductor device formed using the method.

Description of the Related Art

Flash memory is widely used in various electronic devices at present. As the size and process of semiconductor devices shrink, many challenges arise. For example, when manufacturing NOR flash, due to the size reduction, the width of the isolation structure must also be reduced accordingly. In order to facilitate the formation of a control gate (CG), a floating gate (FG) is generally made to have a narrow top and a wide bottom. However, this may also cause the bottoms of adjacent floating gates to be too close, making them interfere with each other.

BRIEF SUMMARY OF THE INVENTION

Embodiments of the present disclosure provide a semiconductor device and a method of forming the same. A semiconductor device that includes an implanted region may be formed by the forming method in the embodiments of the present disclosure. The implanted region is between the bottoms of multiple patterned semiconductor structures (e.g., a floating gate with a narrow top and a wide bottom), which may effectively reduce the dielectric coefficient of these regions, thereby preventing the multiple patterned semiconductor structures from interfering with each other.

Some embodiments of the present disclosure include a method of forming a semiconductor device, and the method of forming the semiconductor device includes the following steps. An isolation structure is formed between a plurality of active areas. Semiconductor structures are formed over the active areas, and a portion of each semiconductor structure is embedded in the isolation structure. Sacrificial structures are formed on the semiconductor structures. An ion implantation process is performed to form implanted regions between the portions of the semiconductor structures embedded in the isolation structure. The sacrificial structures are removed to form patterned semiconductor structures. A dielectric structure is formed on the patterned semiconductor structure. A control structure is formed on the dielectric structure.

Some embodiments of the present disclosure include a semiconductor device. The semiconductor device includes a plurality of active areas and an isolation structure disposed between the active areas. The semiconductor device also includes a plurality of patterned semiconductor structures disposed on the active areas, and a portion of each of the patterned semiconductor structures is embedded in the isolation structure. The semiconductor device further includes a plurality of implanted regions disposed between the portions of the patterned semiconductor structures embedded in the isolation structure. Moreover, the semiconductor device includes a dielectric structure disposed on the patterned semiconductor structures and a control structure disposed on the dielectric structure.

BRIEF DESCRIPTION OF THE DRAWINGS

Aspects of the embodiments of the present disclosure can be understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

FIG. 1 to FIG. 7 are partial cross-sectional views illustrating various stages of forming a semiconductor device 100 according to some embodiments of the present disclosure. Some components of the solid-state image sensor 100 have been omitted in these figures for the sake of brevity.

Figure 1:
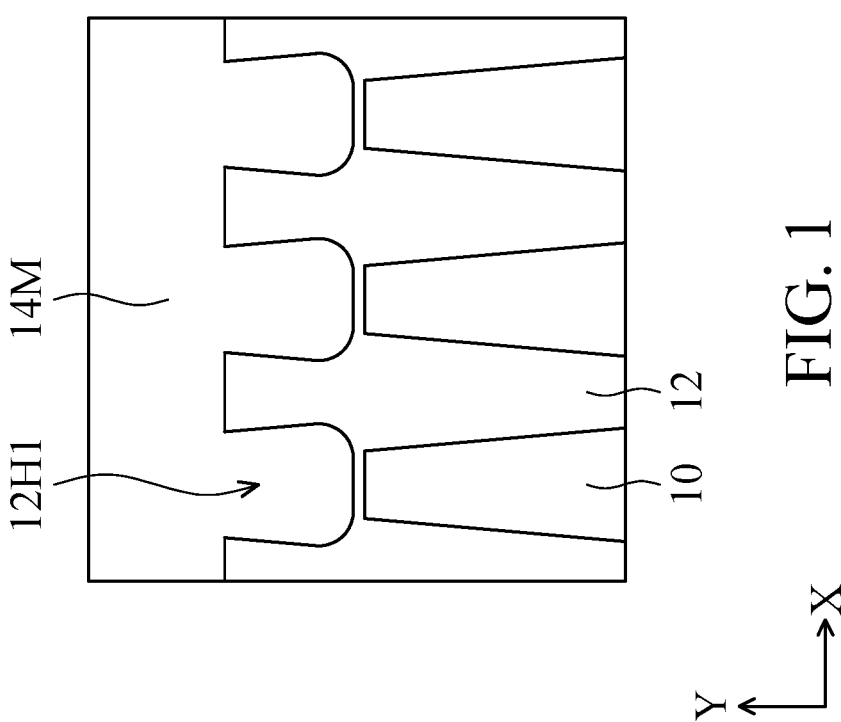

Referring to FIG. 1, in one embodiment, an isolation structure 12 is formed between a plurality of active areas 10. For example, the active area 10 may be a part of the substrate. Here, the substrate may include a bulk semiconductor substrate or a composite substrate formed of different materials, and the substrate may be doped (e.g., using p-type or n-type dopants) or undoped. For example, the substrate may include a semiconductor substrate, a glass substrate, or a ceramic substrate, such as a silicon substrate, a silicon germanium substrate, a silicon carbide substrate, an aluminum nitride substrate, a sapphire substrate, or a combination thereof. Moreover, the substrate may include a semiconductor-on-insulator substrate that is formed by disposing a semiconductor material on an insulating layer, but the present disclosure is not limited thereto.

The isolation structure 12 may include a shallow trench isolation, but the present disclosure is not limited thereto. For example, the isolation structure 12 may include an insulating material (e.g., silicon oxide, silicon nitride, or silicon oxynitride). Moreover, the isolation structure 12 may also have a multi-layer structure (e.g., thermal oxide liner and silicon nitride). In addition, as shown in FIG. 1, a portion of the isolation structure 12 may be formed on the active area 10.

Continuing to refer to FIG. 1, in one embodiment, a plurality of trenches 12H1 are formed in the isolation structure 12. As shown in FIG. 1, the trenches 12H1 correspond to the active areas 10. That is, the trenches 12H1 may be located above the active areas 10. Then, a semiconductor material 14M is formed in the trenches 12H1 and on the isolation structure 12.

For example, a mask layer (not shown) may be disposed on the isolation structure 12, and then an etching process is performed using the aforementioned mask layer as an etching mask to etch the isolation structure 12 into a plurality of trenches 12H1. The etching process may, for example, include a dry etching process, a wet etching process, or a combination thereof. The dry etching process may include reactive ion etching, inductively coupled plasma etching, neutron beam etching, electron cyclotron resonance etching, similar etching processes, or a combination thereof. The wet etching process may, for example, use hydrofluoric acid, ammonium hydroxide, or any suitable etchant.

The mask layer may include photoresist, such as positive photoresist or negative photoresist. In addition, the mask layer may include a hard mask and may include silicon oxide (SiO$_2$), silicon nitride (SiN), silicon oxynitride (SiON), silicon carbide (SiC), silicon carbide nitride (SiCN), similar materials, or a combination thereof, but the present disclosure is not limited thereto.

The mask layer may be a single-layer or a multi-layer structure. The mask layer may be formed by, for example, a deposition process, a photolithography process, other suitable processes, or a combination thereof. The deposition process may include spin coating, chemical vapor deposition, atomic layer deposition, similar processes, or a combination thereof.

Figure 2:
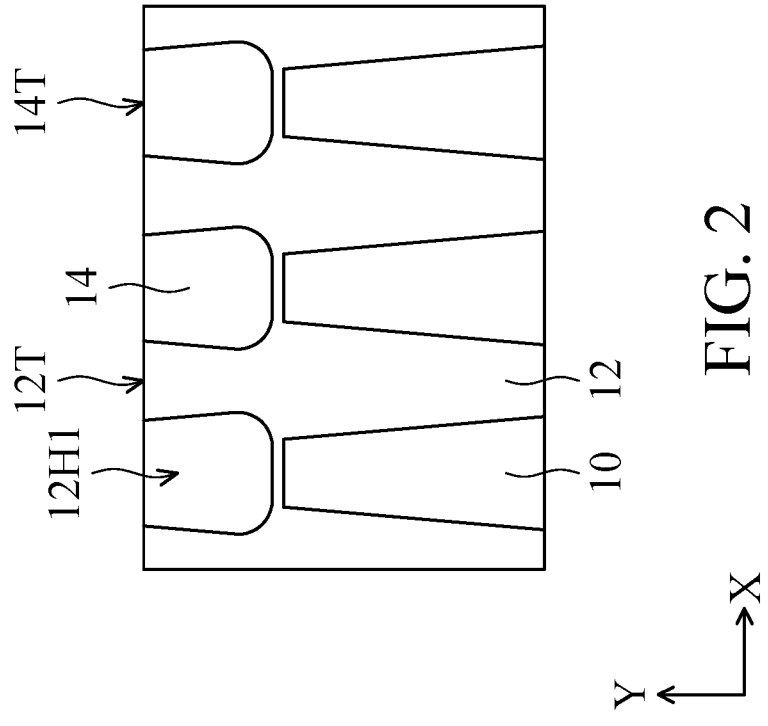
FIG. 1 to FIG. 7 are partial cross-sectional views illustrating various stages of forming a semiconductor device according to some embodiments of the present disclosure.

Referring to FIG. 2, in one embodiment, a portion of the semiconductor material 14M is removed to form semiconductor structures 14. As shown in FIG. 2, the top surfaces 14T of the semiconductor structures 14 and the top surface 12T of the isolation structure 12 are substantially coplanar. For example, a planarization process, such as a chemical mechanical polishing process, may be performed on the semiconductor material 14M, but the present disclosure is not limited thereto.

Figures 3, 4:
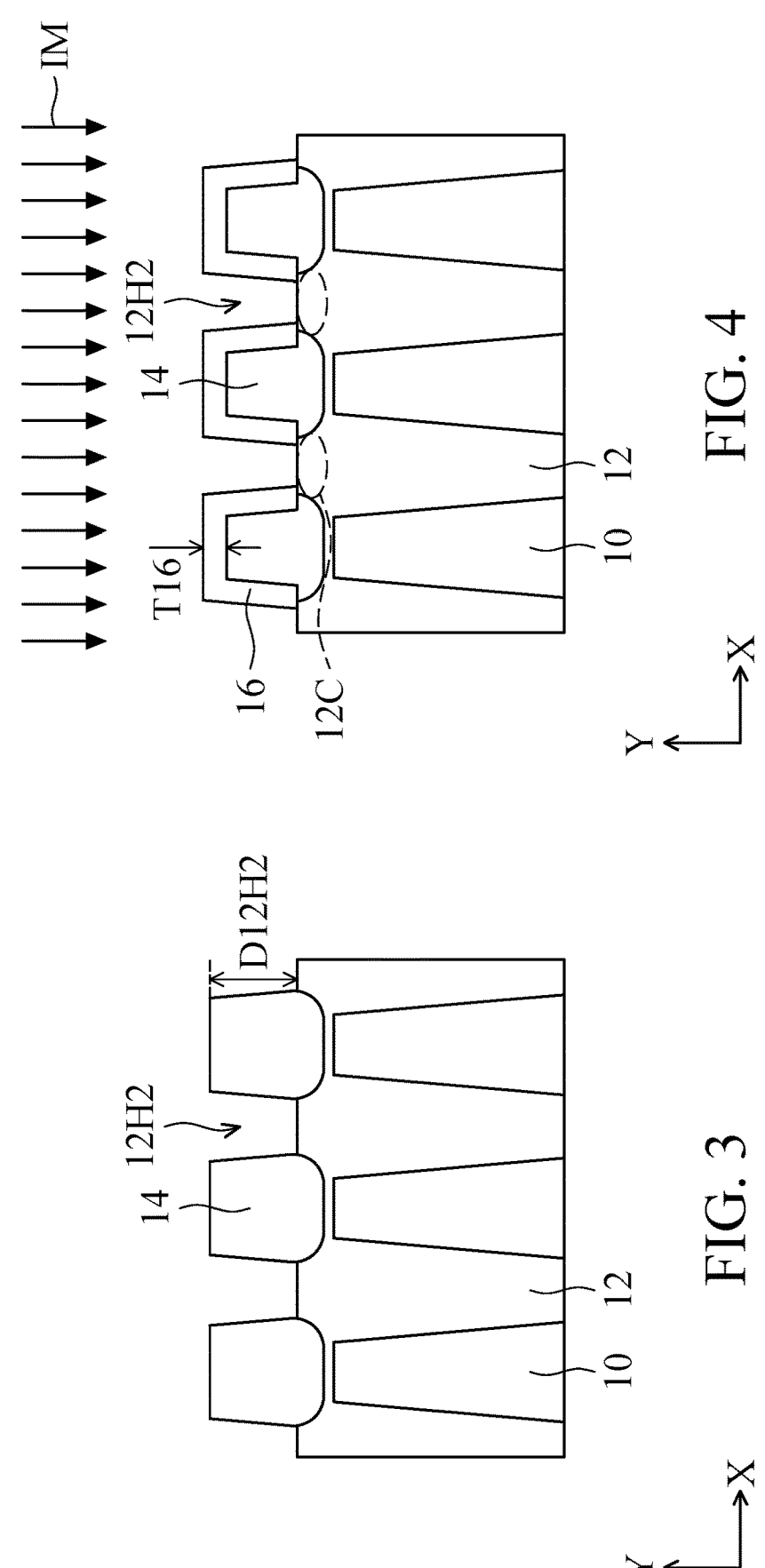

Referring to FIG. 3, in one embodiment, a portion of the isolation structure 12 is removed to form a plurality of trenches 12H2 between the semiconductor structures 14. For example, a patterning process may be performed to form the trenches 12H2. The patterning process includes forming a mask layer (not shown) above the isolation structure 12, and then forming the trenches 12H2 according to the pattern of the mask layer. Examples of the material, formation method, and etching process of the mask layer are as described above, and will not be repeated here.

In one embodiment, the depth D12H2 of the trench 12H2 is about 60 nm to about 70 nm, such as about 65 nm, but the present disclosure is not limited thereto. Moreover, as shown in FIG. 1 to FIG. 3, in one embodiment, a plurality of semiconductor structures 14 are formed above the active areas 10, and a portion of each semiconductor structure 14 is embedded in the isolation structure 12.

Referring to FIG. 4, in one embodiment, a plurality of sacrificial structures 16 are formed over these semiconductor structures 14. In detail, in one embodiment, a wet oxidation process may be performed on the semiconductor structures 14 to form the sacrificial structures 16 on the portion of the semiconductor structures 14 not embedded in the isolation structure 12. In one embodiment, the wet oxidation process includes in-situ steam generation oxidation, but the present disclosure is not limited thereto. In one embodiment, the thickness T16 of the sacrificial structure 16 ranges from about 4 nm to about 6 nm, such as about 5 nm. In other embodiments, a heat treatment process may also be performed to form a plurality of sacrificial structures 16 on the semiconductor structures 14. The heat treatment process includes rapid thermal oxidation (RTO) and rapid thermal nitridation (RTN), but the present disclosure is not limited thereto.

Then, as shown in FIG. 4, in one embodiment, an ion implantation process IM and an annealing process are performed to form a plurality of implanted regions 12C between the portions of the semiconductor structures 14 embedded in the isolation structure 12. In one embodiment, the ion implantation process IM includes carbon ion implantation. After the annealing process, silicon carbide may be formed in the implanted regions 12C.

Figures 5, 6:
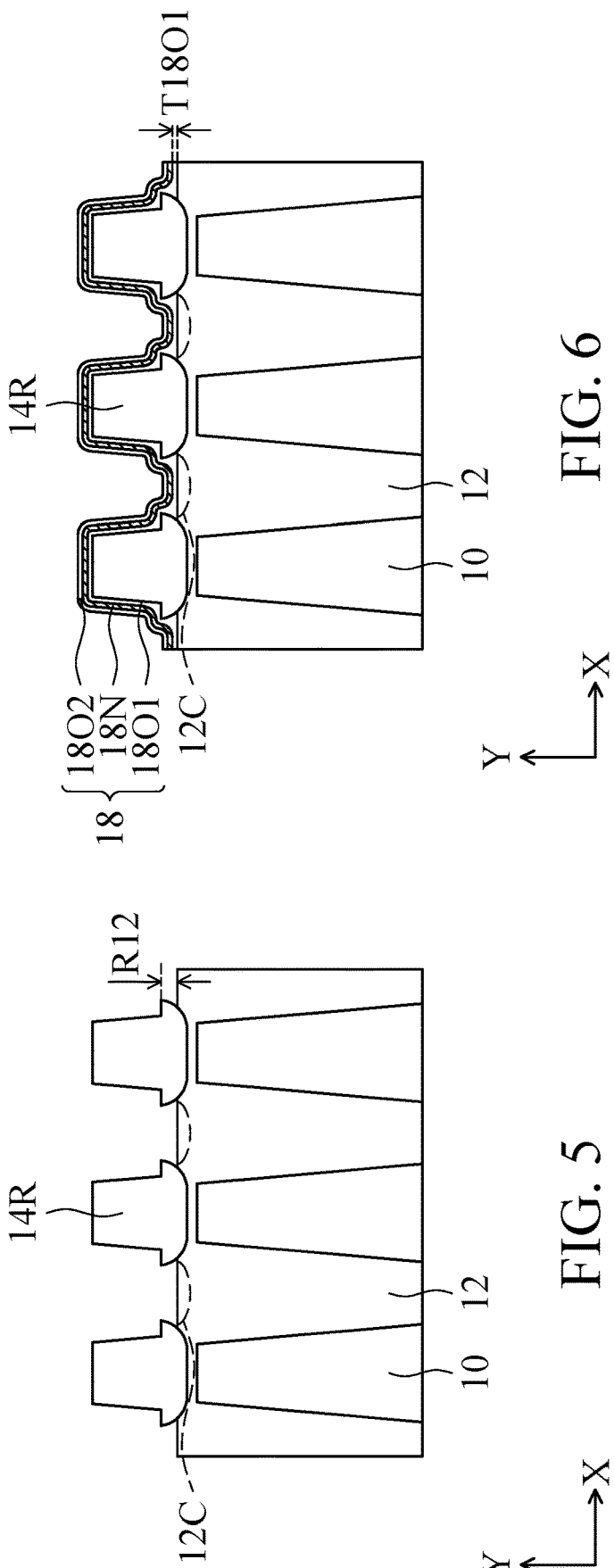

Referring to FIG. 5, in one embodiment, the sacrificial structures 16 are removed to form a plurality of patterned semiconductor structures 14R. As shown in FIG. 5, during the process of removing the sacrificial structures 16, a portion of the isolation structure 12 may be further removed. For example, the thickness R12 of the removed isolation structure 12 is about 5 nm, but the present disclosure is not limited thereto.

After the sacrificial structures 16 are removed, the patterned semiconductor structure 14R may be a semiconductor structure with a narrow top and a wide bottom, and a portion of the patterned semiconductor structure 14R is still embedded in the isolation structure 12. Moreover, although the implanted region 12C may also be partially removed during the aforementioned process, most of the implanted regions 12C are still located between the bottoms of the patterned semiconductor structures 14R.

Referring to FIG. 6, in one embodiment, a dielectric structure 18 is formed on the patterned semiconductor structures 14R. In detail, the dielectric structure 18 is also formed on the isolation structure 12. In one embodiment, multiple atomic layer deposition processes may be performed to sequentially form a dielectric layer 18O1, a dielectric layer 18N, and a dielectric layer 18O2, and the dielectric layer 18N includes a different material than the dielectric layer 18O1 and the dielectric layer 18O2. For example, dielectric layer 18O1 and dielectric layer 18O2 include oxide, and dielectric layer 18N includes nitride. That is, the dielectric structure 18 may be an oxide-nitride-oxide (ONO) structure. In one embodiment, the thickness T18O1 of the dielectric layer 18O1 is about 5 nm, but the present disclosure is not limited thereto.

In addition, in this embodiment, since the dielectric layer 18O1, the dielectric layer 18N, and the dielectric layer 18O2 are formed by an atomic layer deposition process, they may be conformally formed on the patterned semiconductor structures 14R and the isolation structure 12, and modify the sharp corners of the patterned semiconductor structures 14R.

Figure 7:
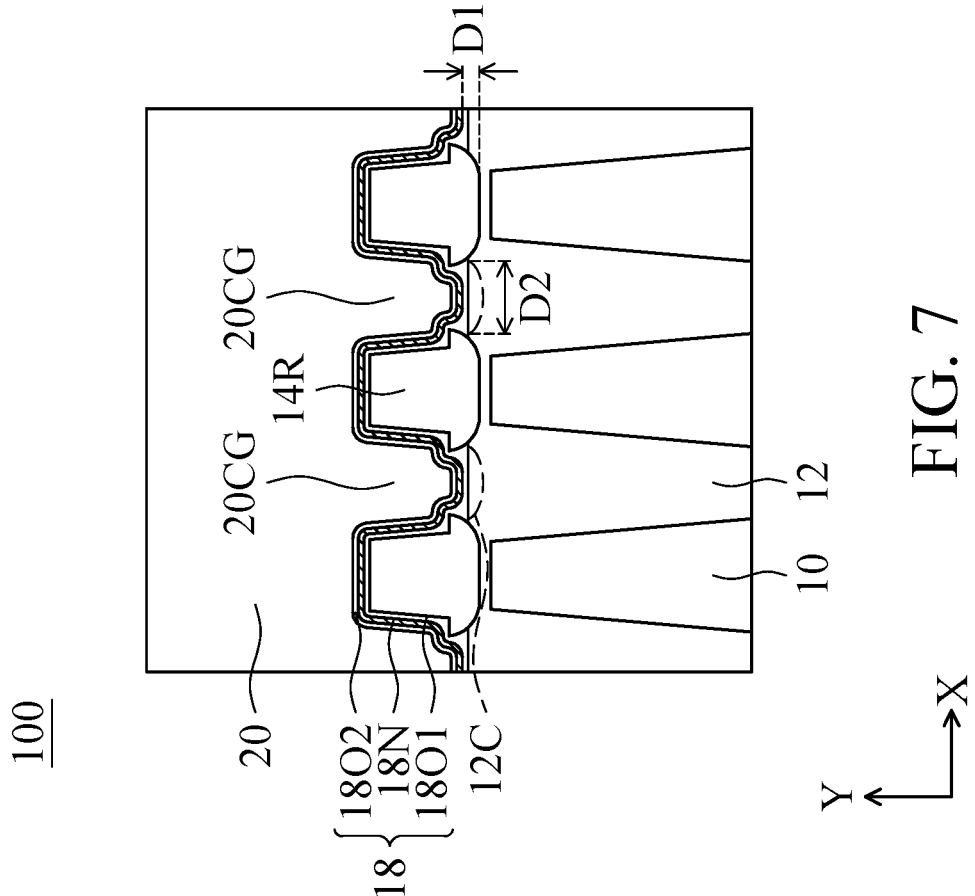

Referring to FIG. 7, in one embodiment, a control structure 20 is formed on the dielectric structure 18 to form the semiconductor device 100. In detail, the control structure 20 is formed on the dielectric layer 18O2, and the control structure 20 is on the patterned semiconductor structures 14R and fills the space between the patterned semiconductor structures 14R (i.e., the control structure 20 includes the control electrode 20CG).

As shown in FIG. 7, in one embodiment, the semiconductor device 100 includes a plurality of active areas 10 and an isolation structure 12 disposed between the active areas 10. The semiconductor device 100 also includes a plurality of patterned semiconductor structures 14R disposed on the active areas 10, and a portion of each patterned semiconductor structure 14R is embedded in the isolation structure 12. The semiconductor device 100 further includes a plurality of implanted regions 12C disposed between the portions of the patterned semiconductor structures 14R embedded in the isolation structure 12. Moreover, the semiconductor device 100 includes a dielectric structure 18 disposed on the patterned semiconductor structures 14R and a control structure 20 disposed on the dielectric structure 18.

In one embodiment, the implanted regions 12C include carbon or silicon carbide, and the width D2 of each implanted region 12C ranges from about 33 nm to about 37 nm, such as about 35 nm, but the present disclosure is not limited thereto.

In one embodiment, the dielectric structure 18 includes a dielectric layer 18O1, a dielectric layer 18N, and a dielectric layer 18O2, the dielectric layer 18O1 is disposed on the patterned semiconductor structures 14R and the isolation structure 12, and the dielectric layer 18N and the dielectric layer 18O2 are sequentially disposed on the dielectric layer 18O1. Furthermore, in one embodiment, the dielectric layer 18N includes a different material than the dielectric layer 18O1 and the dielectric layer 18O2.

As shown in FIG. 6 and FIG. 7, in one embodiment, the ratio of the thickness T18O1 of the dielectric layer 18O1 to the shortest distance D1 from the bottommost section of each patterned semiconductor structure 14R to the bottommost section of the dielectric layer 18N (i.e., T18O1/D1) in the normal direction of the isolation structure 12 (e.g., X direction in FIG. 6 and FIG. 7) is about ⅕.

The semiconductor device 100 may be, for example, a NOR flash memory. As shown in FIG. 7, in this embodiment, the patterned semiconductor structure 14R may be regarded as the floating gate of the semiconductor device 100, and the portion of the control structure 20 between the patterned semiconductor structures 14R (i.e., the control electrode 20CG) may be regarded as the control gate of the semiconductor device 100.

As shown in FIG. 7, the floating gate of the semiconductor device 100 (i.e., the patterned semiconductor structure 14R) has a narrow top and a wide bottom, which facilitates the formation of a control gate (i.e., the control electrode 20CG). Moreover, it is particularly worth mentioning that since the semiconductor device 100 includes the implanted regions 12C between the bottoms of the plurality of patterned semiconductor structures 14R (i.e., floating gates), and the implanted region 12C may include carbon or silicon carbide, the dielectric constant of these regions may be effectively reduced, thereby preventing the plurality of patterned semiconductor structures 14R from interfering with each other.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

What is claimed is:

1. A method of forming a semiconductor device, comprising:

forming an isolation structure between a plurality of active areas;

forming semiconductor structures over the active areas, wherein a portion of each of the semiconductor structures is embedded in the isolation structure;

forming sacrificial structures on the semiconductor structures;

performing an ion implantation process to form implanted regions between portions of the semiconductor structures embedded in the isolation structure, wherein the implanted regions are disposed within an upper portion of the isolation structure;

removing the sacrificial structures to form patterned semiconductor structures;

forming a dielectric structure on the patterned semiconductor structure; and forming a control structure on the dielectric structure, wherein the ion implantation process comprises carbon ion implantation, and the step of forming the semiconductor structures comprises:

forming a plurality of first trenches in the isolation structure, wherein the first trenches correspond to the active areas;

forming a semiconductor material in the first trenches and over the isolation structure;

removing a portion of the semiconductor material to form the semiconductor structures, wherein top surfaces of the semiconductor structures and top surfaces of the isolation structures are coplanar; and removing a portion of the isolation structure to form a plurality of second trenches between the semiconductor structures.

2. The method of forming the semiconductor device as claimed in claim 1, wherein the steps of forming the sacrificial structures comprises:

performing a wet oxidation process on the semiconductor structures to form the sacrificial structures on other portions of the semiconductor structures not embedded in the isolation structure.

3. The method of forming the semiconductor device as claimed in claim 2, wherein the wet oxidation process comprises in-situ steam oxidation.

4. The method of forming the semiconductor device as claimed in claim 1, further comprising:

performing an annealing process after performing the ion implantation process.

5. The method of forming the semiconductor device as claimed in claim 1, wherein the steps of forming the dielectric structure comprises:

performing multiple atomic layer deposition processes to sequentially form a first dielectric layer, a second dielectric layer, and a third dielectric layer, wherein the second dielectric layer comprises a different material than a material of the first dielectric layer and the third dielectric layer.

6. A semiconductor device, comprising:

a plurality of active areas;

an isolation structure disposed between the active areas;

a plurality of patterned semiconductor structures disposed on the active areas, wherein a portion of each of the patterned semiconductor structures is embedded in the isolation structure;

a plurality of implanted regions disposed between portions of the patterned semiconductor structures embedded in the isolation structure, and disposed within an upper portion of the isolation structure;

a dielectric structure disposed on the patterned semiconductor structures; and a control structure disposed on the dielectric structure, wherein the dielectric structure comprises:

a first dielectric layer disposed on the patterned semiconductor structures and the isolation structure;

a second dielectric layer disposed on the first dielectric layer; and a third dielectric layer disposed on the second dielectric layer, wherein the second dielectric layer comprises a different material than a material of the first dielectric layer and the third dielectric layer; and wherein a ratio of a thickness of the first dielectric layer to a shortest distance from a bottommost section of each of the patterned semiconductor structures to a bottommost section of the second dielectric layer in a normal direction of the isolation structure is ⅓.

7. The semiconductor device as claimed in claim 6, wherein the implanted regions comprise carbon or silicon carbide.

\* \* \* \* \*